United States Patent [19]
Hollstein et al.

[11] 3,978,347
[45] Aug. 31, 1976

[54] HIGH BAND WIDTH EMITTER COUPLED LOGIC GATE

[75] Inventors: Roger L. Hollstein, Phoenix; Ramachandra A. Rao, Scottsdale, both of Ariz.

[73] Assignee: Motorola, Inc., Chicago, Ill.

[22] Filed: Oct. 2, 1974

[21] Appl. No.: 511,327

[52] U.S. Cl. ............................... 307/215; 307/218; 307/268; 307/280
[51] Int. Cl.² .................... H03K 19/08; H03K 5/01
[58] Field of Search .......... 307/215, 218, 280, 300, 307/268

[56] References Cited
UNITED STATES PATENTS

| | | | |
|---|---|---|---|
| 3,590,274 | 6/1971 | Marley | 307/215 |
| 3,699,355 | 10/1972 | Madrazo | 307/218 X |
| 3,743,856 | 7/1973 | Leuthold | 307/280 X |
| 3,868,517 | 2/1975 | Schoeff | 307/280 X |

*Primary Examiner*—John S. Heyman
*Attorney, Agent, or Firm*—Harry M. Weiss; Kenneth R. Stevens

[57] ABSTRACT

A high band width logic gate including a basic current switch logic block and emitter-follower output transistors. A switchable active circuit current sink is connected between an internal voltage switching node associated with the current switch logic gate and the emitter terminal of the emitter-follower output transistor. The active current sink is switched between a relatively low conductive state to a relatively high nonsaturating conductive state in order to maintain substantially constant current flow through the emitter-follower output transistor during switching of the logic gate in order to significantly improve AC beta roll off characteristics.

6 Claims, 2 Drawing Figures

HIGH BAND WIDTH EMITTER COUPLED LOGIC GATE

BACKGROUND OF THE INVENTION

1. Field of Invention

This invention relates to a logic gate, and more particularly to improved high speed emitter coupled logic (ECL) gate.

2. Description of the Prior Art

Many prior art ECL gates are data bit rate limited to somewhere around 250 megabits per second. These rates are unacceptable in high speed communication applications, for example in certain pulse code modulating environments. One attempt to increase the speed of ECL gates is directed towards varying circuit impedances in order to reduce current swings in the emitter-follower output transistor during switching. Another situation increases power dissipation and moreover speed improvement is practically limited by design considerations. Another approach is to employ sophisticated processing and device techniques which essentially minimizes collect-to-substrate capacitance in order to improve rise and fall times of the generated signal. In addition to being costly and more difficult to control these approaches are also performance limited when it is desirous to improve the data bit rate by an order of magnitude over that now obtainable with known prior art ECL gates. For example, certain applications require a 600 megabit per second data rate.

It is therefore an object of the invention to provide an improved high speed, high band width ECL gate capable of operating in the 600 megabit per second data range.

Another object of the present invention is to provide an improved ECL gate wherein AC beta roll off is minimized, thus significantly improving rise and fall times, and cross talk also is reduced.

Another object of the present invention is to provide an improved ECL gate capable of operating at significantly higher data bit rates without corresponding output signal attenuation.

In accordance with the aforementioned objects, the present invention provides an ECL logic gate wherein switchable current sinks connected to the emitter terminal of the emitter-follower output transistor maintain a substantially constant current flow through the emitter-follower output transistor during switching of the logic gate.

DESCRIPTION OF THE PREFERRED EMBODIMENTS

Figures 1, 2:
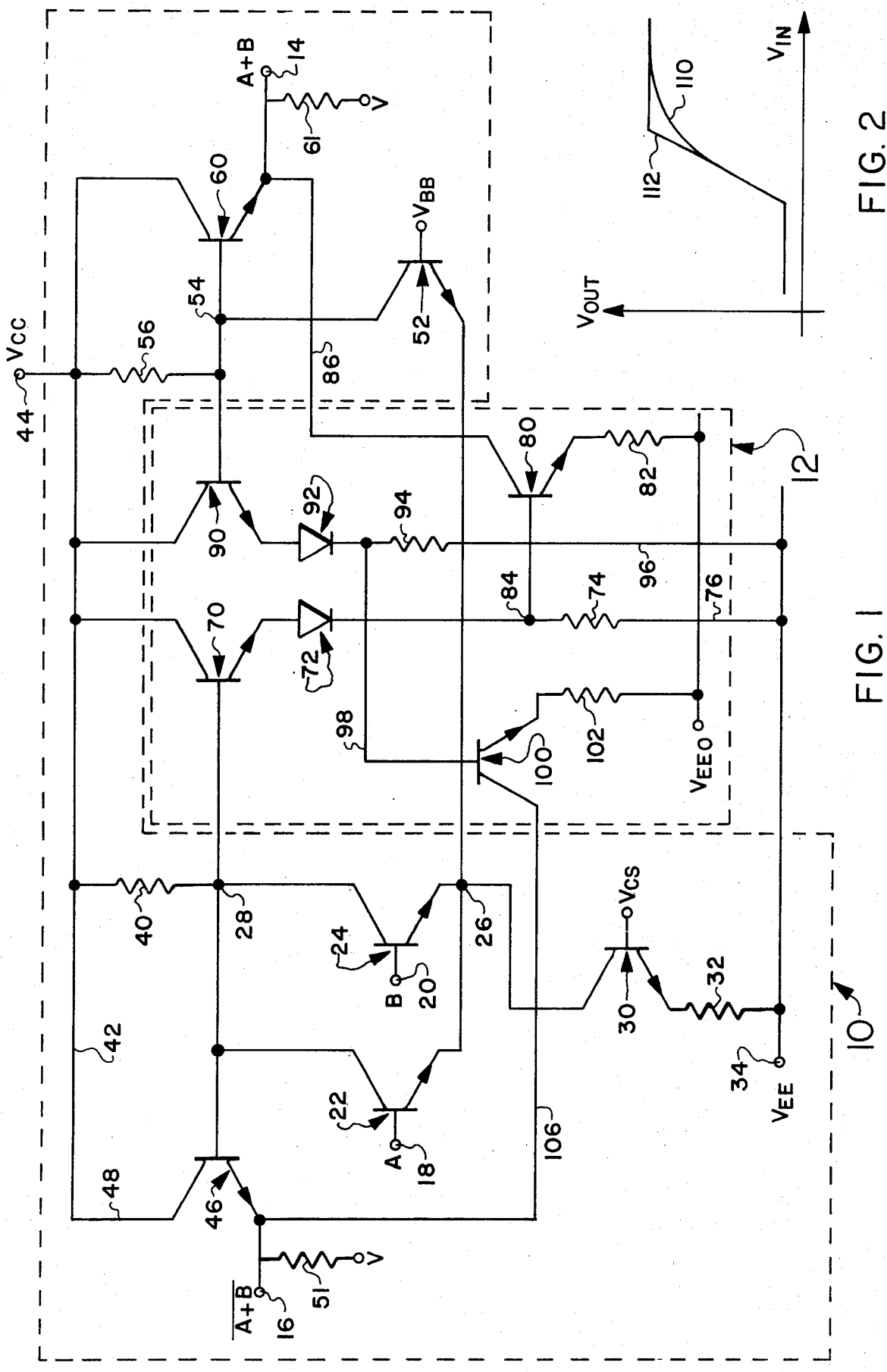
FIG. 1 is a schematic drawing illustrating a basic ECL gate and the switchable current sink circuits for maintaining a substantially constant current flow through the emitter-follower output transistors at both the in-phase and out-of-phase sides of the ECL gate.
FIG. 2 shows a DC and power transfer characteristic curve illustrating the rise-fall time improvement obtainable with the present invention.

Now referring to FIG. 1, it illustrates a conventional emitter-follower coupled logic gate 10 connected to a switchable current sink means 12 for improving the rise-fall time of the logic signals generated at output terminals 14 and 16 constituting the in-phase (OR) output terminal for providing a logic signal A+B and the out-of-phase (NOR) output terminal for providing a logic signal A+B in response to input signals A and B applied to input terminals 18 and 20.

The ECL gate 10 includes a plurality of input switching transistors 22 and 24 connected between a first common emitter node 26 and a collector voltage switching node 28. The base terminals of the input switching transistors 22 and 24 are connected to the input terminals 18 and 20, respectively. A first current source comprising transistor 30 supply voltage $V_{CS}$ and resistor 32 is connected between node 26 and a negative supply voltage $V_{EE}$ connected to terminal 34, which in the preferred embodiment is −5.2 volts. A load impedance or resistor 40 is connected between node 28 and the positive voltage supply $V_{CC}$ connected to common line 42 by means of terminal 44. In the preferred embodiment the voltage $V_{CC}$ is ground potential.

An emitter-follower output transistor 46 is connected at its base terminal to node 28 and at its collector terminal to line 42 by means of line 48. The emitter-terminal of transistor 46 is connected to output terminal 16 which in turn is connected to a line impedance or resistor 51 and voltage supply V, 50 ohms and −2.0 volts in the preferred embodiment. A reference switching transistor 52 is connected at its emitter terminal to node 26 and at its collector terminal to a second voltage switching node 54. The base of transistor 52 is connected to a reference supply voltage $V_{BB}$ of approximately −1.30 volts in the preferred embodiment. An impedance or load resistor 56 is connected between node 54 and line 42. In a similar manner, the OR or in-phase output signal A+B logic output signal is provided at the emitter terminal of an output emitter-follower transistor 60 having its base connected to node 54, its collector terminal connected to line 42, and its emitter terminal connected to output terminal 14. Further, a line impedance or resistor 61 and supply voltage V also is connected to the output terminal 14.

The switchable current sink means 12 comprises a pair of circuits each respectively connected between a voltage switching node and the emitter terminal of an emitter-follower output transistor. Connected between node 28 and the emitter terminal of transistor 60 is a voltage translating circuit comprising transistor 70 and diode 72. The cathode terminal of diode 72 is connected to the reference voltage $V_{EE}$ by means of resistor 74 and line 76. A current sink comprising transistor 80 and resistor 82 is connected between the cathode of diode 72 and the emitter terminal of transistor 60 by means of lines 84 and 86, respectively. The bottom end of resistor 82 is connected to a supply voltage $V_{EEO}$ of approximately −3.2 volts in the preferred embodiment.

Similarly, connected between voltage switching node 54 and the emitter terminal of emitter-follower output transistor 46 is a voltage translating circuit comprising transistor 90 and diode 92. The cathode terminal of diode 92 is connected by means of resistor 94 to reference voltage $V_{EE}$ by means of line 96. Also, the diode 92 is connected by means of line 98 to a current sink comprising transistor 100 and resistor 102. The bottom of resistor 102 is connected to reference voltage $V_{EEO}$. The collector terminal of transistor 100 is connected to the emitter terminal of emitter-follower output transistor 46 by means of line 106.

OPERATION

In a conventional ECL gate the collector current in the emitter-follower output transistor 60 switches between 22 milliamps in an up or binary one level to approximately 5 milliamps in the down or binary zero level. Due to this large current change, the AC beta roll off causes the rise and fall times associated with the output logic signal generated at terminal 14 to exhibit serious rounding of the edges during the transition from one level to another level as illustrated by curve 110 in FIG. 2. At the midpoint in the swing the effect is not as significant but the entire ramp rate still is deleteriously affected. This problem has limited the data bit rate to somewhere in the range of 250 megahertz.

With either logic input signals A or B at a binary up or one level either transistor 22 or 24 is conducting and transistor 52 is off or nonconducting thus placing the base of emitter-follower output transistor 60 at a relatively up or high state and, transistor 60 is conducting. With an impedance load of 50 ohms connected to a −2.0 volt supply, the current through transistor 60 is approximately 22 milliamps. Simultaneously, the base of transistor 70 is low or at a relatively down level and thus very little current flows through resistor 82. Assuming that the logic input signal is going to a logical zero or down level, then transistor 52 begins conducting thus pulling the base of transistor 60 to a low state. Accordingly, the emitter of transistor 60 begins going low thus demanding less current through its collector. However, the base of transistor 70 is going high so as to raise the base potential of transistor 80 to a high state. Thus the collector of transistor 80 requires more current. When the logical input signal completes its transition, transistor 52 is fully conductive and the base of transistor 60 is low. The line impedance or resistor 61 requires approximately 5 milliamps assuming a voltage −V to approximately −2.0 volts. However, with both the base terminals of transistors 70 and 80 at a high state and with the appropriate selection of the value of resistor 82, transistor 80 requires a collector current of approximately 17 milliamps which is supplied from transistor 60 via line 86. Accordingly, 5 milliamps is supplied for the load and 17 milliamps for the collector current of transistor 80. Thus, the collector current of transistor 60 remains at approximately 22 milliamps. Naturally, converse operation occurs when the input again goes to a logical one or up state and an identical operation applies to the emitter-follower transistor 46.

With relatively constant currents being supplied to the emitter-follower transistors, the circuit is always operating in a constant $F_t$ region and the output rise and fall times will have a much sharper transition as illustrated by curve 112 in FIG. 2. Moreover, the higher repetition or data rates are achievable without output signal attentuation. In cases where only one side is brought out of the logic gate an ancillary advantage occurs, the current in the $V_{CC}$ line essentially remains constant, this results in less signal being fed to other portions of the chip or die and thus reduces the cross talk to other outputs not being switched at the same time.

What is claimed is:

1. A high band width current switch logic circuit comprising:
   a. a current switch logic circuit having input terminals for receiving logic signals,
   b. a first emitter-follower output transistor coupled to said current switch logic circuit for providing drive to a first load, and the emitter terminal of said first emitter-follower output transistor constituting a in-phase output terminal means,
   c. a second emitter-follower output transistor coupled to said current switch logic circuit for providing drive to a second load, and the emitter terminal of said second emitter-follower output transistor constituting an out-of-phase output terminal means,
   d. a first switchable current sink means responsive and coupled to a first internal voltage switching node of said current switch logic circuit and coupled to the emitter terminal of said first emitter-follower output transistor for providing a substantially fixed value of current flow through said first emitter-follower output transistor during switching and quiescent operation of said current switch logic circuit in response to said logic signals, and
   e. said first switchable current sink means including a first switchable current source means and an active voltage translating circuit means coupled between said first internal voltage switching node and said first switchable current source means for selectively placing said first switchable current source means either in a high switchable or low conductive state.

2. A high band width current switch logic circuit as in claim 1 further comprising:
   a. a second switchable current sink means responsive and coupled to a second internal voltage switching node of said current switch logic circuit and coupled to the emitter terminal of said second emitter-follower output transistor for providing a substantially fixed value of current flow through said second emitter-follower output transistor during switching and quiescent operation of said current switch logic circuit in response to said logic signals.

3. A high band width current switch logic circuit as in claim 2 wherein:
   a. said second switchable current sink means comprises a second switchable current source means.

4. A high band width current switch logic circuit in claim 3 wherein:
   a. said second switchable current source means further includes a second active voltage translating circuit means coupled between said second internal node and said second switchable current source means for selectively placing said second switchable current source means either in a high or low conductive state.

5. A high band width current switch logic circuit as in claim 4 wherein:
   a. said first and second switchable current source means each comprise a transistor and resistor.

6. A high band width current switch logic circuit as in claim 5 wherein:
   a. said first and second active voltage translating circuit means each comprise a transistor and diode.

* * * * *